(12) United States Patent
Bagley et al.

(10) Patent No.: US 7,343,828 B2
(45) Date of Patent: Mar. 18, 2008

(54) TAPE FED MINIATURE AIR GAP INSPECTION CRAWLER

(75) Inventors: Paul C. Bagley, Middleburgh, NY (US); Kenneth Hatley, Madison, NJ (US); Robert M. Roney, Schoharie, NY (US)

(73) Assignee: The Coca-Cola Company, Atlanta, GA (US)

( * ) Notice: Subject to any disclaimer, the term of this patent is extended or adjusted under 35 U.S.C. 154(b) by 0 days.

(21) Appl. No.: 11/420,870

(22) Filed: May 30, 2006

(65) Prior Publication Data

US 2007/0277630 A1    Dec. 6, 2007

(51) Int. Cl.
*G01M 19/00* (2006.01)

(52) U.S. Cl. .................................................. 73/865.8

(58) Field of Classification Search ................ 73/865.8
See application file for complete search history.

(56) References Cited

U.S. PATENT DOCUMENTS

| 4,704,577 | A | * | 11/1987 | Junker et al. ................ 324/220 |
| 4,938,081 | A | * | 7/1990 | Negishi ....................... 73/865.8 |
| 5,174,164 | A | * | 12/1992 | Wilheim ...................... 73/866.5 |
| 5,650,579 | A | | 7/1997 | Hatley et al. |
| 6,100,711 | A | | 8/2000 | Hatley |
| 2007/0109404 | A1 | * | 5/2007 | Lortie .......................... 348/85 |

* cited by examiner

*Primary Examiner*—Robert Raevis
(74) *Attorney, Agent, or Firm*—Sutherland Asbill & Brennan LLP

(57) ABSTRACT

An air gap inspection device. The air gap inspection device may include a mast and an inspection head attached to the mast. The mast may be in the form of a collapsible tube.

8 Claims, 2 Drawing Sheets

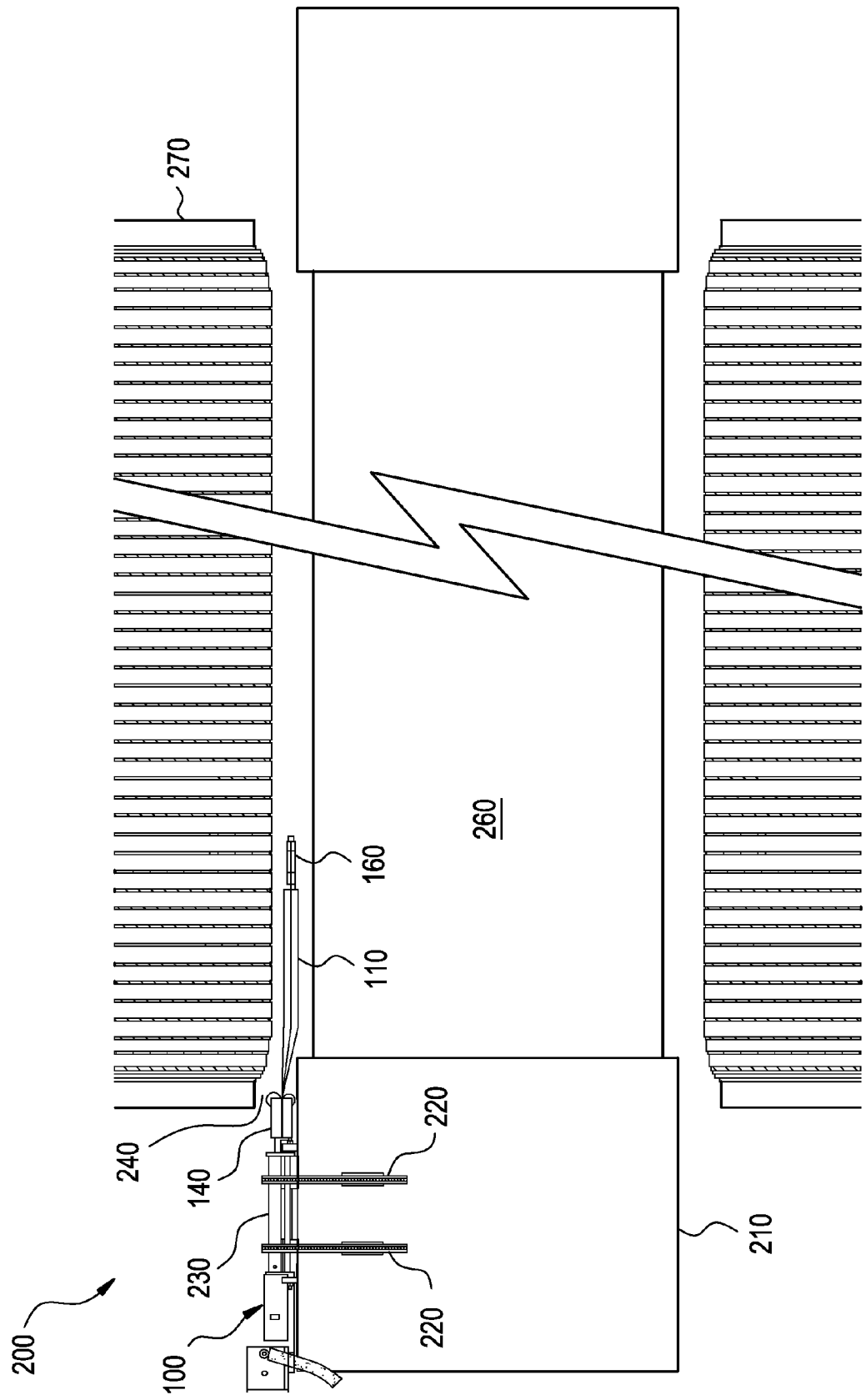

TAPE FED MINIATURE AIR GAP INSPECTION CRAWLER

TECHNICAL FIELD

The present application relates generally to a miniature robotic device and more particularly relates to a miniature robotic device for performing in-situ inspections of a generator field and stator core.

BACKGROUND OF THE INVENTION

The visual inspection of a generator field and a stator core should be performed on a periodic basis. Conventional generator field/stator core inspection and testing procedures typically require the complete disassembly of the stator core and the removal of the generator field before any inspections or tests can be performed on the unit. The costs of the disassembly and removal of the generator field, the time it takes to complete this process, and the dangers inherent in generator field removal have led to the occasional omission of the examination of the generator field and the stator core from routine outage schedules.

In-situ inspections of generators have been performed by employing poles, trolleys, and field turning techniques. These procedures generally have not accomplished the inspection task in a satisfactory manner.

Miniature air gap inspection crawlers ("magic") are disclosed in commonly owned U.S. Pat. Nos. 5,650,579 and 6,100,711, the disclosures of which are hereby incorporated by reference. These crawlers are designed to pass through the radial air gap between the core iron and the retaining ring for an in-situ inspection of the generator field and stator core.

Video cameras and other inspection tools may be attached to the crawler to perform the inspection of the generator field and the stator core. For example, a high resolution video camera may provide a clear view of the stator core laminations, stator wedges, field wedges, and the inboard ends of the retaining rings. The crawler thus provides detection capability for loose stator wedges, vibration bar sparking, core lamination damage due to foreign objects, motoring and hot spots, field wedge arcing, and surface heating damage. Similarly, commonly owned U.S. patent application Ser. Nos. 11/163,196, 11/306,600, and 11/306,601 describe the ultrasonic inspection of the field and the stator core. These patent applications are incorporated herein by reference. Through the in-situ inspection the generator, information may be gathered on the overall condition of the generator that can help determine if removal of the field is necessary.

Although these known devices are adequate for in-situ generator inspections, they are largely limited to use with entrance gaps that are greater than about one half inch (about 12.7 millimeters). If the entrance gap is smaller than about one half inch (about 12.7 millimeters), the field generally must be pulled out of the stator for inspection.

Thus, there is a desire for an inspection device that can accommodate entrance gaps of less than about one half inch (about 12.7 millimeters). Preferably, the inspection device can provide visual inspection, ultrasonic inspection, wedge tightness testing, electric core testing, and other types of inspections and testing.

SUMMARY OF THE INVENTION

The present application thus describes an air gap inspection device. The air gap inspection device may include a mast and an inspection head attached to the mast. The mast may be in the form of a collapsible tube.

The mast may include spring steel, nickel alloy, or carbon fiber composites. The mast may include a collapsed profile and an expanded profile. The mast may include a collapsed profile with a width of about 0.05 to about 0.2 inches (about 1.3 to about five (5) millimeters) and an expanded profile with a width of about one (1) to about 2.5 inches (about 25.4 to about 63.5 millimeters). The inspection head may include a camera.

The air gap inspection device further may include a coil such that the mast is stored within the coil. The air gap inspection device further may include a drive mechanism such that the mast is driven by the drive mechanism. The air gap inspection device further may include a mounting plate such that the mounting plate connects the inspection head and the mast.

The present application further describes a method of inspecting a generator field via an entrance gap with an air gap inspection device having an inspection head and a mast. The method may include positioning the inspection head on the mast, inserting the inspection head and the mast through the entrance gap, advancing the mast, and inspecting the generator field with the inspection head.

The method further may include the step of storing the mast and the step of storing the mast may include storing the mast in a collapsed profile. The step of advancing the mast may include advancing the mast in an expanded profile.

The present application further describes an air gap inspection crawler. The air gap inspection crawler may include a mast with a collapsed profile and an expanded profile and an inspection head positioned about the mast. The inspection head may include a camera.

The mast may include spring steel, nickel alloy, or carbon fiber composites. The collapsed profile may include a width of about 0.05 to about 0.2 inches (about 1.3 to about five (5) millimeters) and the expanded profile may include a width of about one (1) to about 2.5 inches (about 25.4 to about 63.5 millimeters). The air gap inspection crawler further may include a coil such that the mast is stored within the coil. The air gap inspection crawler further may include a drive mechanism such that the mast is driven by the drive mechanism.

These and other features of the present application will become apparent to one of ordinary skill in the art upon review of the following detailed description when taken in conjunction with the drawings and the appended claims.

BRIEF DESCRIPTION OF THE DRAWINGS

FIG. 4 is a side plan view of the tape fed miniature air gap inspection crawler of FIG. 1 shown in a generator.

DETAILED DESCRIPTION

Figure 1:
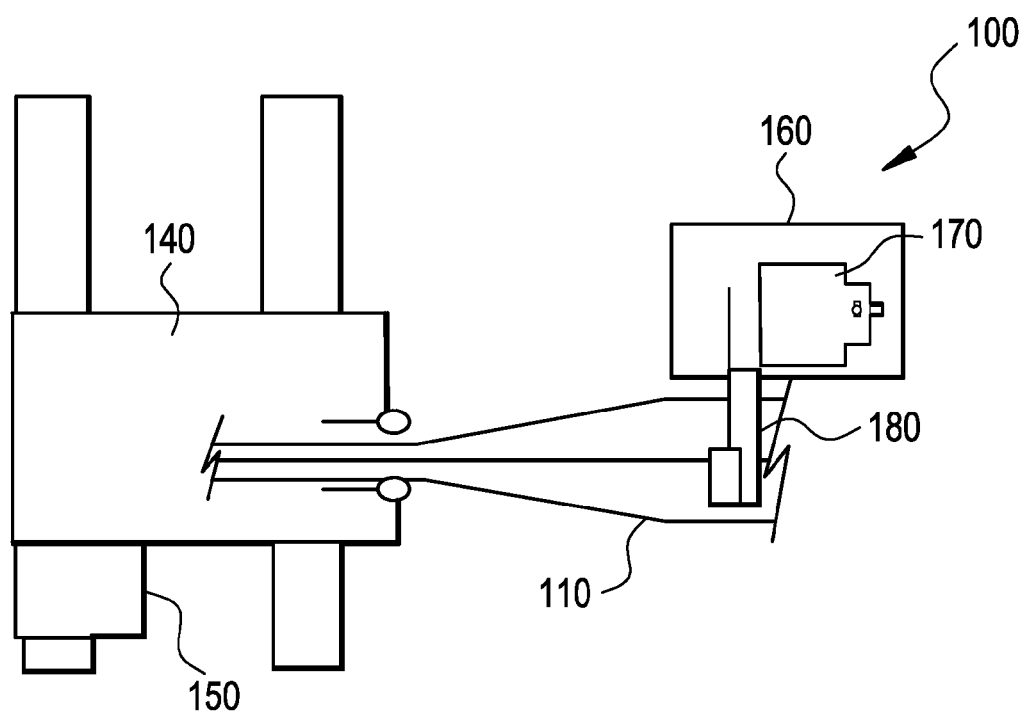
FIG. 1 is a schematic view of a tape fed miniature air gap inspection crawler as is described herein.
Figure 2:
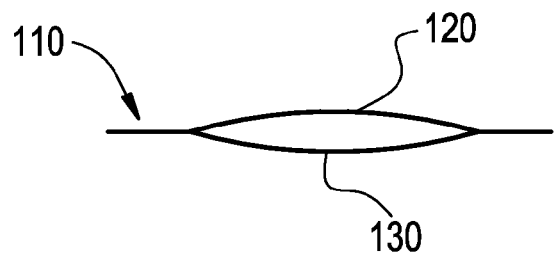
FIG. 2 is a side cross-section view of a mast of the tape fed miniature air gap inspection crawler of FIG. 1 shown in a collapsed profile.
Figure 3:
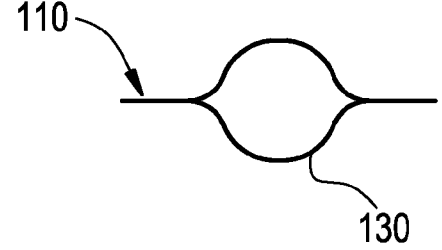
FIG. 3 is a side cross-section view of the mast shown in expanded profile.

Referring now to the drawings, in which like numerals refer to like elements throughout the several view, FIGS. 1-3 show a miniature air gap inspection crawler 100 as is described herein. The miniature air gap inspection crawler 100 includes an extendable mast 110.

The mast 110 may be largely in the form of a collapsible tube with a first side 120 and a second side 130. The mast 110 preferably is made from a somewhat rigid material but with some flexibility and memory. Examples of such materials include spring steel, nickel alloy, carbon fiber composites, and similar types of materials. As is shown in FIGS. 2 and 3, the mast 110 may have a collapsed profile in which the sides 120, 130 are close together and largely flat and an expanded profile in which the sides 120, 130 flex and separate from each other. The sides 120, 130 may be welded together lengthwise or the sides 120, 130 may be joined by adhesives, mechanical fasteners or similar techniques. Other types of expandable structures may be used herein.

In its collapsed state, the mast 110 may have a width (the vertical direction shown in FIGS. 2 and 3) of about 0.05 to about 0.2 inches (about 1.3 to about five (5) millimeters). In its expanded state, the mast 110 may have a width of about one (1) to about 2.5 inches (about 25.4 to about 63.5 millimeters). The mast 110 may have any desired length. In this example, the mast 110 has a length of about five (5) to about fifteen (15) feet (about 1.5 to about five (5) meters). Any desired length may be used herein.

The mast 110 may be stored within a coil 140 when not in use. Other types of storage means may be used herein. The coil 140 may be connected to a drive means 150 so as to advance and retract the mast 110 to any desired length. The drive means 150 may be an electric motor, piston, or similar type of drive devices.

The miniature air gap inspection crawler 100 further may include an inspection head 160. In this example, the inspection head 160 schematically includes a camera 170 for illustration purposes. The camera 170, generally described, may include a forward view camera of fixed focus used for navigation and detection, and a variable view camera with a power focus assembly and a right angle prism to allow for viewing of the stator and the field surfaces. Any desired type of camera may be used herein. The inspection head 160 may have a width of about one (1) to about three (3) inches (about 25 to about 75 millimeters). These dimensions may vary as desired.

Alternatively or in addition to, the inspection head 160 also may include an ultrasonic transducer of conventional design. The transducer may detect cracks as small as about 0.25 inches (about 6.35 millimeters). The inspection head 160 also may include a means for spreading couplant before the transducer. (Couplant is a material (usually liquid) that facilitates the transmission of ultrasonic energy from the transducer into the test specimen.) The inspection head 160 also may include a wedge tightness module to perform a wedge tapping test. Likewise, the inspection head 160 may carry an ELCID coil (Electromagnetic Core Imperfection Detector) for inspecting shorted stator punchings. Any other type of inspection device may be used herein alone or in combination.

The miniature air gap inspection crawler 100 further may include a mounting plate 180. The mounting plate 180 may attach the inspection head 160 to the mast 110. The mounting plate 180 may be attached to the mast 110 via weld, mechanical fastener, or similar types of connection means. Other types of mounting devices may be used herein.

In use as is seen in FIG. 4, the inspection head 160 may be attached to one end of the mast 110 via the mounting plate 180. The miniature air gap inspection crawler 100 then may be positioned adjacent to a generator 200. Specifically, the miniature air gap inspection crawler 100 may be attached to a retaining ring 210 of the generator 200 via a number of flexible tracks 220. The miniature air gap inspection crawler 100 may be used with a tractor section 230 so as to move the miniature air gap inspection crawler 100 circumferentially about the retaining ring 210. The tractor section 230 may be similar to that described in commonly owned U.S. Pat. No. 6,100,711 described above.

The inspection head 160 and the mast 110 then may be positioned within the air gap 240. The mast 110 will be in its collapsed state as it advances out of the coil 140 and through the air gap 240. Once the mast 110 passes through the air gap 240, the mast 110 will flex to its expanded state so as to be sufficiently rigid to advance the inspection head 160. The drive system 150 then may be engaged so as to maneuver the mast 110 along the length of the generator field 250 and the stator core 260 with the inspection head 160 performing the desired inspections. Once the mast 110 completes the length of the field 250, the mast 110 may be rotated such that the inspection head 160 may take another pass.

It should be apparent that the foregoing relates only to the preferred embodiments of the present application and that numerous changes and modifications may be made herein by one of ordinary skill in the art without departing from the general spirit and scope of the invention as defined by the following claims and the equivalents thereof.

We claim:

1. A system for inspecting beyond an air gap, comprising:
   a mast for passing through the air gap and extending therebeyond;
   the mast comprising a radially collapsible tube; and
   an inspection head attached to the mast.

2. The system of claim 1, wherein the mast comprises a collapsed profile and an expanded profile.

3. The system of claim 1, further comprising a drive mechanism and wherein the mast is driven by the drive mechanism.

4. The system of claim 1, wherein the mast comprises spring steel, nickel alloy, or carbon fiber composites.

5. The system of claim 1, wherein the mast comprises a collapsed profile with a width of about 0.05 to about 0.2 inches (about 1.3 to about five (5) millimeters).

6. The system of claim 1, wherein the mast comprises an expanded profile with a width of about one (1) to about 2.5 inches (about 25.4 to about 63.5 millimeters).

7. The system of claim 1, wherein the inspection head comprises a camera.

8. The system of claim 1, further comprising a mounting plate and wherein the mounting plate connects the inspection head and the mast.

* * * * *

UNITED STATES PATENT AND TRADEMARK OFFICE
CERTIFICATE OF CORRECTION

PATENT NO. : 7,343,828 B2 Page 1 of 1
APPLICATION NO. : 11/420870
DATED : March 18, 2008
INVENTOR(S) : Paul C. Bagley et al.

It is certified that error appears in the above-identified patent and that said Letters Patent is hereby corrected as shown below:

On the title page item (73) Assignee, should be as follows:

(73) Assignee: General Electric Company, Schenectady, NY (US)

Signed and Sealed this

Sixth Day of January, 2009

JON W. DUDAS
*Director of the United States Patent and Trademark Office*